United States Patent [19]

Groenenboom

[11] 4,293,813
[45] Oct. 6, 1981

[54] CURRENT MEASURING SYSTEM

[75] Inventor: Maarten Groenenboom, Enter, Netherlands

[73] Assignee: Hazemeijer B.V., Hengelo, Netherlands

[21] Appl. No.: 14,089

[22] Filed: Feb. 22, 1979

Related U.S. Application Data

[63] Continuation of Ser. No. 815,274, Jul. 13, 1977, abandoned.

[30] Foreign Application Priority Data

| Jul. 13, 1976 | [NL] | Netherlands | 7607752 |
| Jun. 8, 1977 | [NL] | Netherlands | 7706316 |
| Jun. 8, 1977 | [NL] | Netherlands | 7706317 |

[51] Int. Cl.³ .............. G01R 33/02; G01R 1/20; G01R 31/02
[52] U.S. Cl. .................. 324/117 R; 324/51; 324/127
[58] Field of Search ............ 324/117 R, 127, 51

[56] References Cited

U.S. PATENT DOCUMENTS 3,768,011  10/1973  Swain .............. 324/117 R

Primary Examiner—Ernest F. Karlsen
Attorney, Agent, or Firm—John P. Snyder

[57] ABSTRACT

Current measuring system particularly suitable for use as an earth leakage detection system and functional device equipped with such a system e.g. an earth leakage switch.

7 Claims, 10 Drawing Figures

CURRENT MEASURING SYSTEM

This is a continuation of application Ser. No. 815,274, filed July 13, 1977, now abandoned.

BACKGROUND OF THE INVENTION

The invention relates to a current measuring system, more particularly for use as an earth leakage detection system, comprising a weak magnetic circuit having one or more primary windings to conduct the current to be measured or currents to be detected for their sum of difference value and having a secondary winding included in a series connection of an electric supply source, a switching device for changing the polarity of the voltage applied by the supply source to the secondary winding, a current detection device for supplying a switching signal to the switching device when the current passing through the winding has attained a predetermined limit value, and a load impedance integrating the current passing through the series connected circuit. Such a system is disclosed in Swain U.S. Pat. No. 3,768,011, issued Oct. 23, 1973.

As is disclosed in lines 6–12 of column 6 of U.S. Pat. No. 3,768,011, such a system exhibits a positive feedback effect. This effect results in that any asymmetry phenomena occurring in the system are amplified to an extent such that the value of the load impedance used in the system has to be limited, which may give rise to an undesirable limitation of the available output voltage. Such phenomena of asymmetry may occur in particular when as a result of an excessively slow commutation or change of polarity of the voltage supplied by the source to the secondary winding the parameters of the circuit elements, usually transistors, tend to play too important part in said commutation.

BRIEF SUMMARY OF THE INVENTION

The present invention has for its object to provide an improvement in this respect and to provide a current measuring system of the type described above suitable for measuring both direct current and alternating current, in which in order to obtain an output voltage of adequate value a load impedance of comparatively high value may be employed without the risk of undesirable phenomena of asymmetry.

According to the invention in a current measuring system of the kind set forth the supply source, the switching device and/or the current detection device are constructed so that a transgression of the limit value by the current flowing through the series circuit produces an abrupt voltage drop. Owing to this precaution it is ensured that the operational parameters of the circuit elements employed will not adversely affect the symmetry obtained at the change of polarity of the voltage fed from the supply source to the secondary winding.

In the first embodiment of the invention in which the current detection device and the switching device are combined into an electronic circuit and the series circuit includes a current measuring resistor such as is disclosed in the U.S. Pat. No. 3,768,011, the invention proposes, in order to obtain the intended abrupt voltage drop, to form the circuit by a differential amplifier with positive feedback and with negative feedback from the current measuring resistor. The desired abrupt voltage drop is accompanied with the abrupt polarity change occurring at the attainment of the limit value by the current flowing through the current measuring resistor as a result of the positive feedback of the differential amplifier.

In this embodiment the current measuring resistor and the load impedance may be included in the negative feedback path on the side of the earth or reference potential. According to the invention a measuring or processing circuit responding to the output voltage of the amplifier may be connected between the output of the differential amplifier and a point of reference potential.

As in U.S. Pat. No. 3,768,011, this invention also proposes a second embodiment in which the switching device is formed by a bridge circuit of four transistors being pairwise in the conductive state, while a series connection of the secondary winding and the integrating load impedance at its ends is connected to two opposite corners of the bridge circuit. In this case the invention suggests feeding the bridge circuit by way of a current limiting circuit operating as a current detection device and adjusted to such a current limit value that, when the current fed to a pair of transistors of the bridge circuit exceeds said limit value, a non-conductive state of said pair of transistors occurs.

The limiting circuit may be formed by a current mirror circuit having a current measuring resistor determining the current limit value by its resistance value. In this case a still more abrupt voltage drop, that is to say in accordance with a characteristic curve having a negative slope part, can be obtained by connecting to the current measuring resistor in parallel the series connection of a second resistor and the emitter-collector circuit of a transistor whose base is held at the potential of the supply voltage so that the current limit value is determined by the substitute resistance value of the parallel connection of the two resistors, but the voltage drop occurs in accordance with a voltage-current characteristic curve having a part of negative resistance value. Such a characteristic curve may be chosen so that the influence of all further resistance components such as represented by the base current of the transistors of the bridge circuit and the output impedance of the current reflective circuit is at least obviated.

As stated above, the steps mentioned in the preceding paragraph are intended to obtain an abrupt voltage drop in order to ensure in this way that the operational parameters of the circuit elements employed will not adversely affect the symmetry obtained at the change of polarity of the voltage fed by the supply source to the secondary winding. The severe requirements of the symmetry for the benefit of detection sensivity often involve, however, that the magnetic circuit should be saturated so that the remanent flux, if any, is completely erased. The comparatively high peak current required for this purpose imposes, however, severe requirements on the saturation voltage of the transistors serving as circuiit elements of the circuitry forming a differential amplifier or a bridge circuit. Differences in saturation voltages between the transistors used will result in asymmetry of the polarity change. It is, therefore, advisable to construct the current measuring system so that the saturation voltage of the circuit transistors need not meet particular requirements.

For this purpose the invention suggests connecting a capacitor in parallel to at least one of the windings of the magnetic circuit, the value of said capacitor being preferably such that, when the magnetic circuit approaches the saturated state, such a peak current can be supplied in order that together with the associated winding it produces an instantaneous field intensity which corresponds at least to the saturation inductance of the magnetic circuit. Such a precaution permits the peak current to bypass the circuit transistors. If, for example, a capacitor is connected in parallel to the secondary winding of the magnetic circuit, an avalanche-like discharge of the capacitor will occur at the initiation of the voltage drop across the secondary winding. Then a satisfactorily reproducible commutation or polarity change is obtained since part of the magnetic energy is fed back as electric energy to the capacitor. As a result the polarity of the capacitor voltage changes.

As advantages of this measure according to the invention may be mentioned:

1. At each commutation the peak current is supplied, independently of the switching transistors, invariably by the same component, that is to say, the capacitor.

2. The voltage change rate is limited so that the risk of radio frequency interference radiation is considerably reduced.

3. The risk of a comparatively high-frequency, primary current disturbing the correct operation of the circuitry decreases.

4. The power supply apparatus need not be capable of supplying transient high currents.

The capacity value of the capacitor may be derived in the following manner from the quantity of energy required for building up the supplementary magnetic flux.

$$\tfrac{1}{2} \cdot C \cdot U^2 = V_Y \int_{B_1}^{B_2} H \cdot dB$$

wherein
 C = capacity value,
 U = peak voltage at capacitor,
 $V_Y$ = iron volume of the annular core,
 H = magnetic field intensity,
 B = magnetic inductance.

The current measuring system according to the invention is suitable for various ways of employment. When used as a current measuring system having a linear transfer characteristic, in which a measuring or control-signal of a value proportional to that of the primary current to be measured is obtained, the system embodying the invention may be advantageously connected to a trigger circuit responding to the value across the integrating load impedance or to an energizing circuit of a different type operating on the active current principle. The use of a separate circuit of the last-mentioned type is redundant, according to the invention, when the load impedance of the current measuring system is directly formed by the activating coil of a functional device, for example, the switching-off coil of an earth leakage switch.

When the system is used as a detection system having two discrete detection states, it may be advisable to use a carrier wave detector responding to the multivibrator voltage produced, the output voltage serving to control an energizing device operating on the idling current principle. This use provides the possibility of obtaining a "fail-safe" structure of a system as will be described later. Finally in accordance with the invention it is in some cases advisable to construct the bistable, electronic circuitry so it responds, in addition, to the alternating current flowing through the primary surge impedance as a result of the alternating voltage induced by the circuit in the primary winding so that a value decrease of this surge impedance to below a given threshold value is detected.

As stated above, the invention provides not only a current measuring system but also a functional device, for example, a control device, a monitoring device, a safety device, a checking device, an alarm device or earth leakage switch equipped with a current measuring system in accordance with the invention. As stated above, it is possible for the load impedance of the current measuring system to be formed directly by the activating coil of the functional device, for example the switching-off coil of an earth leakage switch (circuit breaker).

BRIEF DESCRIPTION OF THE DRAWING FIGURES

FIG. 1 is a diagram of a current measuring system in accordance with the principles of the invention, FIG. 2A is a diagram of a practical embodiment of a current measuring system in accordance with the invention, FIG. 2B is a variant of a detail of FIG. 2A, FIG. 3 is a diagram of an embodiment of the invention operating more particularly as a ground leak detection system included in or added to an earth leakage switch, FIG. 4 is a diagram of a variant of the embodiment shown in FIG. 3, FIGS. 5A and 5B show the basic diagram and the voltage/current characteristic curve of a first embodiment of the current limiting circuit according to the diagram of FIG. 4, FIGS. 6A and 6B show the basic diagram and the voltage/current characteristic curve respectively of a second embodiment of the current limiting circuit according to the diagram of FIG. 4 and FIG. 7 is a diagram corresponding to the diagram of FIG. 1 of a current measuring system in accordance with the principles of the invention, in which a capacitor is connected in parallel to the secondary winding of the magnetic circuit.

DETAILED DESCRIPTION OF THE INVENTION

Figure 1:
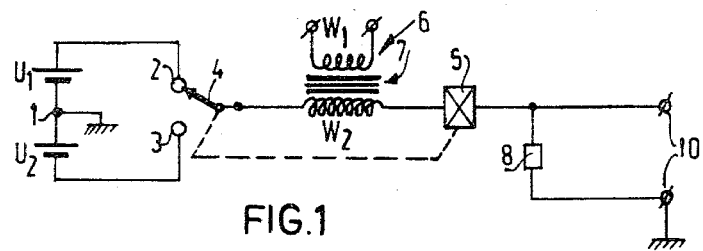

The basic diagram of a current measuring system embodying the invention shown in FIG. 1 comprises two direct voltage sources $U_1$ and $U_2$ of relatively equal voltages, connected in series to one another at one end and grounded at a junction 1. At the other ends the voltage sources $U_1$ and $U_2$ are connected to the fixed contacts 2 and 3 respectively, when together with a movable contact 4 and the energizing winding 5 for driving the contact 4, constitute the most important parts of a relay responding to the transgression of a current limit value and serving as a switching device.

The movable contact 4 and the energizing winding 5 include between them the secondary winding $W_2$ of a transformer 6 having a core 7 of a weak magnetic material, on which is arranged, apart from the single secondary winding $W_2$, a primary winding $W_1$.

The primary winding $W_1$ represents in the basic diagram of FIG. 1 one or more, as the case may be, separated primary windings, which may be connected each in series to one of the conductors not shown in FIG. 1 of a uniphase or a multiphase supply mains. It is assumed that through the winding $W_1$ passes the vectorial sum current of the currents flowing through such mains conductors. This vectorial sum current will hereinafter be termed the "primary" current or the current "to be measured".

The series current circuit from the junction 1 of the voltage sources $U_1$ and $U_2$ via the relay contacts 2, 3 and 4, the secondary winding $W_2$ to the relay energizing winding 5 is grounded through a load impedance 8, which is of the integrating type and may be formed by the parallel connection of a resistor and a capacitor. The output voltage appearing at this impedance is available at the output terminals 10 and may be applied as a measuring signal to a measuring instrument (not shown) or, if necessary subsequent to amplification, or subsequent to another processing as a control or switching signal to any other functional device, such as an earth leakage switch or a signalling device.

The system shown in FIG. 1 operates as follows.

The energizing winding 5 is dimensioned so that the movable relay contact 4 switches over as soon as the current flowing through the secondary winding $W_2$ reaches in one direction or the other a predetermined limit value $i_d$. This limit value $i_d$ may be but need not be chosen to be so high that the core 7 is driven fully into its state of magnetic saturation. As stated above, this choice depends upon the desired properties of linearity, sensitivity and reproducibility of the system.

If no current passes through the primary winding $W_1$, the current $i_m$ passing through the secondary winding $W_2$ of the transformer 6 is a purely alternating current so that the mean value of said current measured by integration over one complete period of the voltage across the load impedance 8 is equal to zero. In this case no signal appears at the output terminals 10. The switching frequency is determined by the number of volt-seconds the secondary winding $W_2$ is capable of absorbing before the current $i_m$ attains the predetermined limit value $i_d$.

The system according to this invention is capable of measuring either direct current flowing through the primary winding $W_1$ or an alternating current flowing therein. The switching frequency is chosen such that it is of considerably higher value than the frequency of any alternating current which is to be measured. In this way, the current flowing in the primary winding $W_1$ will be "seen" as a direct current component by the measuring system. Of course, the current being measured may be a direct current also, or it may be an alternating current having a superimposed direct current component due, for example, to the presence of semiconductor elements in the circuitry being monitored.

If as a consequence of an earth leakage in a practical circuitry or of any phenomenon to be detected, a current starts flowing through the primary winding $W_1$, the magnetization state of the core 7 will change in correspondence wih such current flow so that the current $i_m$ loses its originally symmetrical nature, the mean value of the secondary winding current then varying to an extent such that the mean value of the residual flux in the core 7 remains zero. Since the means value of the current producing a voltage at the output terminals 10 as a result of integration by, for example, the impedance 8 exhibits a linear relationship to the mean value of the primary of earth leakage current through the winding $W_1$, the voltage appearing at the output terminals 10 will form a measure for the primary or earth leakage current and may be used in the manner described above as a measuring signal or as a control signal for safety purposes.

Figures 2A, 2B:
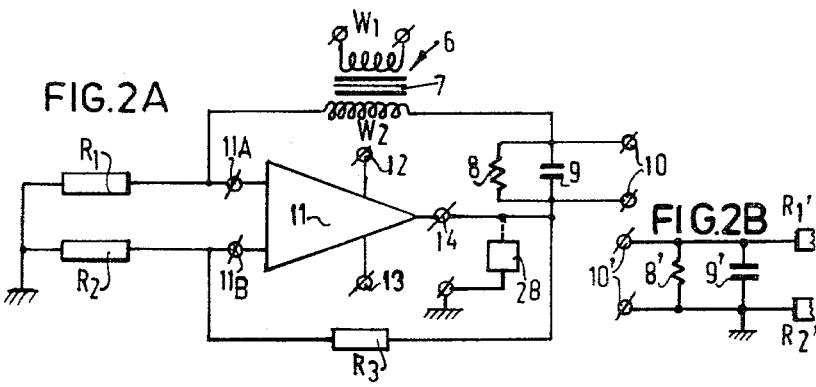

With reference to FIG. 2A a practical embodiment of the measuring system in accordance with the invention will now be described. The relay with the elements 1 to 5 of the basic diagram shown in FIG. 1 is replaced by a differential amplifier 11 having a very high amplification factor, which is fed through its supply terminals 12 and 13 by positive and negative supply $\pm U$ respectively. The differential amplifier 11 has an inverting input 11A, a noninverting input 11B and an output 14. The two inputs 11A and 11B are grounded through resistors $R_1$ and $R_2$, respectively. The output 14 is fed back through a resistor $R_3$ to the noninverting input 11B so that the circuitry obtains a bistable character. The output 14 of the amplifier 11 is furthermore fed back to the inverting input 11A through the parallel combination of a resistor 8 and a capacitor 9 serving in this case as an integrating output inpedance of the measuring system in the secondary winding $W_2$ of a transformer 6 similar to that of FIG. 1.

It will be obvious that as a result of the bistable effect produced by the feedback with the aid of the resistors $R_2$ and $R_3$ the amplifier 11 performs the same function as the relay with the contacts 2, 3 and 4 of FIG. 1 and that for the current $i_m$ supplied by the output 14 of the amplifier 11 to the secondary winding of the transformer $W_2$ the same is valid as for the current supplied by the movable relay contact 4 of FIG. 1. The threshold or limit value $i_d$, at which a change-over occurs, is determined by the resistance values of the resistors $R_1$, $R_2$ and $R_3$ and the value of the supply voltage $\pm U$ of the amplifier 11. At the output terminals 10 there appears, when a current to be measured, for example an earth leakage current to be detected, flows through the primary transformer winding $W_1$, a signal which is a measure for the mean value of the magnetizing current and hence of the current to be measured or to be detected through the primary winding $W_1$.

Referring to FIG. 2A the broken lines indicate that between the amplifier output 14 and ground there may be included a measuring or processing circuit represented by the block 28, which responds to variations of the output voltage of the amplifier 11, which exhibits a purely symmetrical waveform in the rest position of the system (no current flowing in the primary winding $W_1$).

FIG. 2B shows a variant of a detail of the diagram of FIG. 2A. This detail relates to the placement of the components 8, 9 and 10. In the variant shown in FIG. 2B they are included as the components 8', 9' and 10', respectively, between the resistor $R_1$, and ground so that the load impedance 8', 9' in this case is series connected to the secondary winding $W_2$ through the amplifier input 11A subjected to negative feedback.

Figure 3:
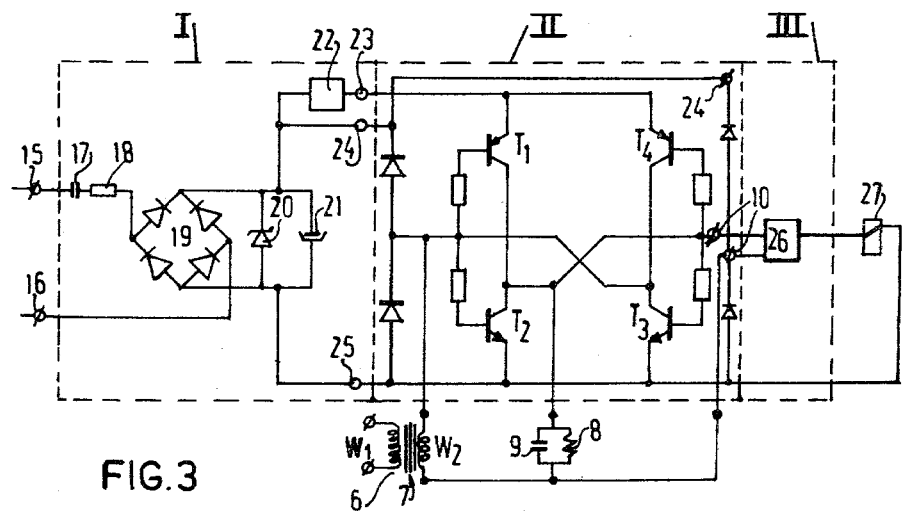

FIG. 3 shows a preferred embodiment of the invention particularly suitable for use with or for incorporation in an earth leakage switch. The diagram shown in FIG. 3 may roughly be divided into the following main parts:

a power supply apparatus to be connected to the mains, represented as a whole by the block I outlined by broken lines;

a multivibrator circuit fed from said power supply I and represented integrally by the block II indicated by broken lines, to which is connected the series combination of the secondary transformer winding $W_2$ and the integrating load impedance 8, 9 already described with reference to FIG. 2;

a processing or energizing circuit III following the multivibrator circuit II and selected in accordance with the detection or measurement aimed at, which circuit may have the character of a so-called "trigger circuit" 26;

a switching-off coil 27 adapted to be energized by the energizing circuit III and being associated with an earth leakage switch not shown in detail in the drawing.

The power supply apparatus I comprises input terminals 15 and 16 for coupling with the A.C. supply means (not shown), the series combination of a capacitor 17 and a resistor 18, a rectifying circuit 19 in the form of a diode bridge circuit and a Zener diode 20 and a smoothing capacitor 21 connected in parallel to the output of the circuit 19. The apparatus furthermore comprises a current limiting circuit designated in general by 22 so that the output terminals 23 and 25 of the apparatus I operate as a direct current source and the output terminals 24 and 25 as direct-voltage source. Provided these conditions are satisfied, the power supply apparatus I may be constructed in any other appropriate manner.

The multivibrator circuit II comprises a bridge circuit of four transistors $T_1$, $T_2$, $T_3$ and $T_4$, which are pairwise interconnected crosswise in the manner illustrated in FIG. 3 so that during the normal multivibrator operation the transistors $T_1$, $T_3$ and $T_2$, $T_4$ are alternately in the conducting and the non-conducting state. To the transistor electrodes determining the conductive states of these transistor pairs there is connected the series circuit of the secondary winding $W_2$ of the transformer 6 and the integrating load impedance mentioned before and including the resistor 8 and the capacitor 9.

The multivibrator operation of the circuit II is as follows:

As in the embodiments described above, the attainment of the limit current value $i_d$ by the magnetizing current $i_m$ through the secondary winding $W_2$ serves as a criterion for the changeover of the multivibrator circuit II used as a switching circuit in the embodiment shown in FIG. 3.

As stated above, the power supply apparatus I comprises a current limiting circuit 22 which, as will be apparent from FIG. 3, supplied the emitter current for the transistor $T_1$ or the transistor $T_4$. The limiting circuit 22 is so dimensioned and adjusted that the voltage between the output terminals 23 and 25 of the power supply apparatus I drastically and abruptly decreases when the current supplied by the current source, that is to say through the limiting circuit 22, to the emitter of the transistor $T_1$ or the transistor $T_4$ exceeds the aforesaid limit value $i_d$. This comparatively abrupt drop of the voltage at the terminal 23 results in that either the transistor pair $T_1$, $T_3$ or the pair $T_2$, $T_4$ which is conductive at the instant concerned, respectively, can no longer maintain the current. The voltage commutation then forced by the self-inductance of the winding $W_2$ initiates the conduction of the other transistor pair $T_2$, $T_4$ or $T_1$, $T_3$. As a result the current $i_m$ will start to increase in the opposite sense. When the limit value $i_d$ is attained, this time in the other current direction through the secondary winding $W_2$, again a strong voltage drop occurs at the supply terminal 23, the other transistor pair $T_2$, $T_4$ or $T_1$, $T_3$ is now blocked so that the cycle is completed and a new cycle begins.

During the normal multivibrator operation and in the absence of a current through the primary transformer winding $W_1$ the mean current averaged over a multivibrator period is equal to zero so that no control or switching voltage for the energizing circuit III will appear at the output terminals 10 of the circuit II. As soon as a primary current, more especially earth leakage current, presenting the character of a direct current to the circuit II, starts flowing through the primary winding $W_1$, the current supplied by the multivibrator circuit II will lose its symmetrical character so that its mean value, measured again by integration of the voltage across the load impedance 8, 9, will differ from zero. The resultant voltage signal appearing across the output terminals 10 of the multivibrator circuit II is applied to the energizing circuit III constructed, for example, as a suitable "trigger" circuit 26, the output of which supplies a switching signal to the switching-off coil 27 of the earth leakage switch controlled thereby. It should be noted that the energizing circuit 26 is also supplied from the power supply apparatus I, i.e. through the output terminals 24 and 25 thereof, but the supply lines and the further details of the energizing circuit are not shown in the diagram of FIG. 3. This also applies to the further details of the earth leakage switch, only the switching-off coil 27 being shown in FIG. 3. It furthermore should be noted that in some cases the system is capable of operating without a separate energizing circuit III like the trigger circuit 26 so that the load impedance of the system is then directly formed by or is coupled with the activating coil of the functional device such as the switching-off coil 27 of an earth leakage switch.

As stated above, the polarity of the voltage appearing across the load impedance 8, 9 gives an indication of the sense of the current through the primary winding $W_1$. The availability of such an indication may in many cases facilitate analysis of the phenomenon measured.

Before the further merits of the multivibrator circuit shown in FIG. 3 are considered, a description of some special embodiments of the current limiting circuit used will be given with reference to FIGS. 4, 5A, 5B and 6A, 6B, starting with reference to the diagram of FIG. 4.

Figure 4:
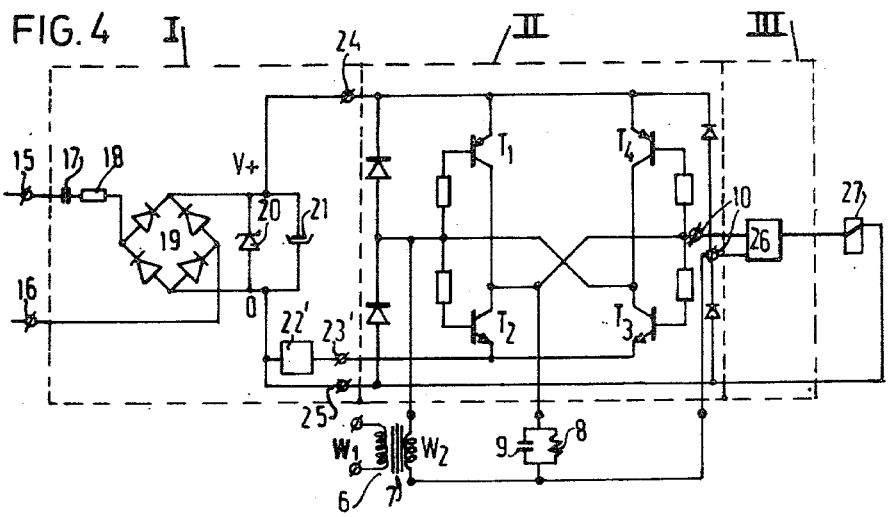

The diagram according to FIG. 4 differs from that according to FIG. 3 only in that in the former case the emitters of the transistors $T_1$ and $T_4$ are not separately fed through the current limiting circuit 22' and the output terminal 23' of the power supply apparatus I, but the emitters of the transistors $T_2$ and $T_3$ are separately fed through the current limiting circuit 22' and the output terminal 23' of the power supply apparatus I. This means that the current limiting circuit included in the emitter current circuits of the transistors $T_2$ and $T_3$ is displaced from the side of the positive supply potential, designated hereinafter by "$V_+$" and appearing at the output terminal 24 of the power supply apparatus, to the side of the supply potential appearing at the output terminal 25 and designated hereinafter by "O". Since the operation of the circuit arrangement does not change in any way as a consequence thereof, the further details and the operation of the circuitry shown in FIG. 4 is as above described in conjunction with FIG. 3.

Figure 5A:
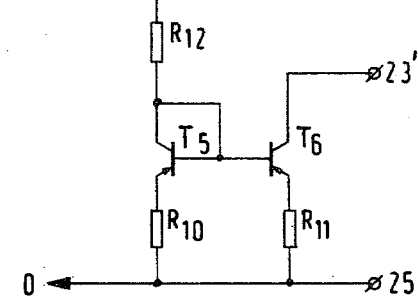

FIG. 5A illustrates the basic diagram of an embodiment of the current limiting circuit 22' in accordance with the invention, which is formed by a so-called "current mirror circuit" of known type having two transistors $T_5$ and $T_6$ and a resistor $R_{12}$ determining the collector current value of the transistor $T_6$.

The resistors $R_{10}$ and $R_{11}$ serve solely to obtain a given commutation ratio, i.e. so that it may be assumed that the limit value of the current I flowing through the output terminal 23' is determined by the limit value of the current through the resistor $R_{12}$ multiplied by the quotient of the resistance values of the resistors $R_{10}$ and $R_{11}$ (I $R_{10}/R_{11} \cdot I_{R12}$). This measure for obtaining a given current commutation ratio is also known per se. It will be assumed hereinafter that the resistance values of the resistors $R_{10}$ and $R_{11}$ are equal to one another so that it may be assumed that the current I through the output terminal 23' is equal to the current through $R_{12}$.

Figure 5B:
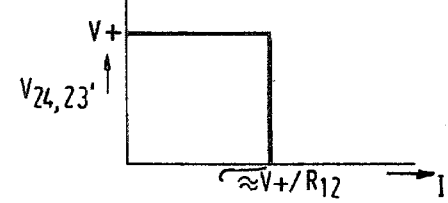

FIG. 5B shows the voltage/current characteristic curve of this circuitry, the values of the current I being plotted along the abscissa and the values of the voltage $V_{24,23'}$ between the terminals 23' and 24 along the ordinate. As long as the current I through the output terminal 23' remains at lower values than the limit value $V_+/R_{12}$ of the current mirror circuit, substantially the full voltage $V_+$ will be present between the output terminals 24 and 23'. If subsequently the emitter current of the transistor $T_2$ or of the transistor $T_3$ of the bridge circuit II tends to exceed the limit value $V_+/R_{12}$, this is prevented by the resistor $R_{11}$ included in the collector line of the transistor $T_5$, the voltage $V_{24,23'}$ then disappearing. It will be obvious that by a suitable choice of the values of the resistors $R_{10}$, $R_{11}$ and $R_{12}$ a limit value may be obtained for the output current I via the supply terminal 23' which corresponds to the limit value $i_d$ desired for the detection circuit II.

Figure 6A:
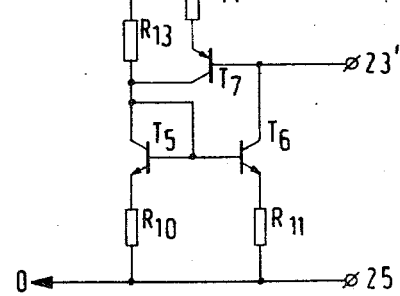

FIG. 6A shows the basic diagram of another embodiment of the current limiting circuit 22'. In this case the resistor $R_{12}$ of the diagram of FIG. 2A is replaced by the parallel combination of a resistor $R_{13}$ and a resistor $R_{14}$ included in the emitter-collector circuit of a transistor $T_7$. The base of the transistor $T_7$, which is connected as an emitter-follower, is connected to the output terminal 23'.

Figure 6B:
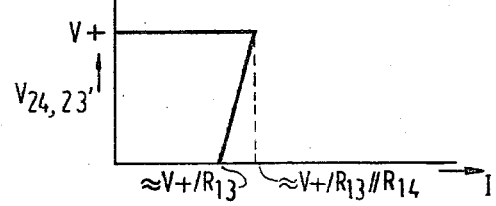

FIG. 6b shows the effect of this arrangement. If it is assumed that $R_{12}=R_{13} \cdot R_{14}/(R_{13}+R_{14})$, the circuitry of FIG. 3a will behave, up to the limit value $V_+/(R_{13}/R_{14})$, in the same manner as the circuitry of FIG. 2a. When this limit value is attained, the voltage across the terminals 23',24' will drop, while the voltage across the resistor $R_{14}$ drops proportionally through the transistor $T_7$ connected as an emitter-follower. As a result the total current supplied to the transistor $T_5$ will drop appreciably more strongly than in the circuitry of FIG. 5A, the parallel connection of the resistors $R_{13}$ and $R_{14}$ being interrupted so that the voltage across the terminals 23', 24 drops to zero as if the current limit value of I were determined not by the value $V_+/(R_{13}/R_{14})$ but by the value $V_+/R_{13}$. FIG. 6B, therefore, shows a characteristic curve having a portion displaying a negative slope. This slope may be chosen so that all resistance components, as represented by the base current the transistors of the bridge circuit II and formed by the further resistance components of the load connected to the output terminals, are compensated for. It is ensured in this way that the current limiting circuit 22' has a low internal resistance until the limit value is attained, and thereafter exhibits a negative internal resistance, the value of which is preferably lower than the parasitic resistance connected in parallel to the secondary winding. Thus, a rapid and symmetrical communication of the mulivibrator circuit II is obtained. These properties are of great importance since the positive feedback effect of the circuit II (see U.S. Pat. No. 3,768,011, column 6, lines 6–12) will produce such an amplification of any asymmetry that the value of the resistor 8 and hence the value of the output voltage will have to be drastically limited. From the foregoing it will be apparent that the invention provides the possibility of eliminating such limitation, which is particularly important when the load impedance of the current measuring system is directly formed by the activating coil of a functional device, such as the switching-off coil of an earth leakage switch.

Figure 7:
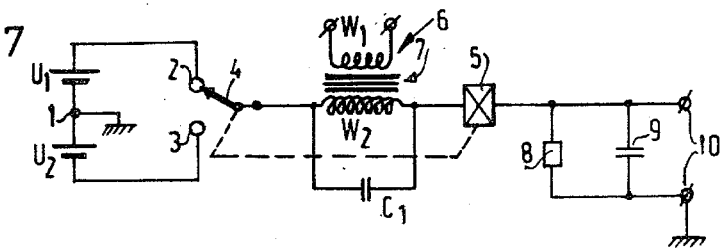

In connection with the above-mentioned symmetrical commutation obtained both in the embodiment shown in FIG. 2 and in the circuit II of FIGS. 3 and 4, reference is furthermore made to the basic diagram of FIG. 7. The severe requirements of symmetry to be imposed on the polarity change of the voltage supplied to the secondary winding of the magnetic circuit frequently involve that the magnetic circuit has to be saturated to an extent such that the remanent flux, if any, is erased. The comparatively high peak current required to this end imposes severe requirements on the saturation voltage of the transistors serving as circuit elements, as stated above, since differences in saturation voltage between the transistors employed result in asymmetry of the polarity change.

FIG. 7 illustrates, as will be apparent from a comparison to the basic diagram of FIG. 1, a very simple step for obviating the said drawback, that is to say, a parallel connection of a capacitor $C_1$ to the secondary winding $W_2$ of the transformer 6. The capacitor $C_2$ has a capacitance which is sufficiently high for providing, when the magnetic circuit on the core 7 approaches the saturation state, such a peak current that together with the winding $W_2$ it produces an instantaneous field strength which corresponds at least to the saturation inductance of the magnetic circuit.

Such a step permits the peak current to bypass the switching transistors. If, for example, a capacitor is connected in parallel to the secondary winding of the magnetic circuit, an avalance-like discharge of the capacitor will occur at the instant at which the voltage across the secondary winding starts decreasing. Thus a satisfactorily reproducible commutation or polarity change is obtained, since part of the magnetic energy is fed back to the capacitor as an electric energy. As a consequence thereof, the polarity of the capacitor is changed over.

Advantages of this arrangement according to the invention are:

1. At each commutation the peak current is supplied independently of the circuit transistors invariably by the same component, that is to say, the capacitor.

2. The voltage variation rate is limited so that the risk of interference radiation is appreciably reduced.

3. The risk of a comparatively high-frequency, primary current disturbing the correct operation of the circuitry decreases.

4. The power supply apparatus need not be capable of supplying transient high currents.

The capacitance value of the capacitor may be derived in the following manner from the quantity of energy required for building up the supplementary magnetic flux.

$$\tfrac{1}{2} \cdot C \cdot U^2 = V_y \int_{B_1}^{B_2} h \cdot dB,$$

wherein
C = capacity value,
U = peak voltage at capacitor $V_Y$ = iron volume of the annular core
$H$ = magnetic field strength
$B$ = magnetic inductance.

It should be noted that it may be desirable artificially to enhance the resistance value of the secondary winding by connecting a resistor separately in series with said winding. Such a precaution may be useful to protect the capacitor then connected in parallel to the series combination of the secondary winding and the additional resistor as well as the further circuitry, since at the occurrence of high primary peak currents, the induced voltage may be higher so that saturation of the core 7 of the transformer 6 will occur earlier, which restricts the energy transfer, the circuitry being thus protected.

It should be noted that the step described herein should not be mistaken for the step of connecting in parallel to the secondary winding a network itself consisting of the series connection of a capacitor and a resistor. Such a network only serves to protect the transistors from excess voltages. The series resistor, which in that case is connected in series with the capacitor rather than with the coil, serves to prevent the occurrence of high peak currents produced by the capacitor and to attenuate high-frequency switching phenomena.

As stated above, the inventive measure considered is rather intended to cause the capacitor instead of the transistors to supply the comparatively high peak currents desirable for erasing the remanent flux at the commutation or polarity change of the voltage applied to the secondary winding in order to obtain satisfactory symmetry.

After the explanation given with reference to FIGS. 4-7 of some special details of the current behavior of the circuit II of FIG. 3 (and FIG. 4) the following remarks may be made with respect to the operation of this circuitry. From the foregoing description it appears that the system in FIG. 3 has the nature of a current measuring system, which means that the resultant measuring signal constitutes a measure of the current through the primary winding $W_1$ or of the sum or difference component of the currents, respectively, through a plurality of individual primary windings which together are symbolized by the primary winding $W_1$. It will be obvious that in case of appropriate dimensioning of the integrating load impedance 8,9 and as a consequence of low-ohmic short-circuiting of one or more of the primary windings, suitable control with the aid of the circuit 26 or of the passing of a high value current through such a primary winding, there may result such a situation that a changeover of the multivibrator can no longer be performed so that it switches off. This property brings about a number of special uses of the current measuring system of FIG. 3, some of which are particularly important.

In the first place it can be stated that the multivibrator circuit II is sensitive to the value of the terminal matching impedance of the primary winding $W_1$ of transformer 6, since an excessively low value of said impedance will have the nature of a short-circuit of the primary winding $W_1$. This provides the possibility of using a current detection system according to the invention in order to obtain information about the state of the galvanic contact conduction within a system access to which for reasons of a high voltage level may be difficult. It is furthermore possible to obtain information about a short-circuit between the zero conductor of a practical system and ground; without discussing the details of this phenomenon it is noted that the occurrence of such a short-circuit may have an influence falsifying the nature of an earth leakage. The current measuring system shown in FIG. 3 can be employed for the detection and ranging of such phenomena and defects and, generally, in contact situations where direct access is difficult. To that end it is sufficient to construct the bistable circuit in a manner (not shown) such that it also responds to the alternating current flowing through the primary external matching impedance as a result of the alternating voltage induced in the primary winding $W_1$ by the circuitry, so that the detection of a drop in value of this matching impedance below a predetermined threshold value is obtained.

Secondary, the following is noted. The description of the energizing circuit III has been limited to the statement that in the embodiment concerned in this circuit may have the nature of a so-called "trigger" circuit. Such a circuit may be considered to operate on the so-called "active current principle", which means that the circuit becomes operative or supplies a current which is active as a switching or control-signal only when it is activated by a measuring voltage emanating from the load impedance 8,9. The fact that the multivibrator circuit II may get into a completely blocked state under the above-mentioned conditions, provides the possibility of using a carrier wave detector responding to the multivibrator voltage produced, rather than an energizing circuit such as the "trigger" circuit 26 of FIG. 3, the output signal of said detector serving for controlling an energizing device operating on the idling current principle. In the rest position, that is to say, as long as the multivibrator signal is detected, this energizing device will provide a control-signal intended to continue the operation. When the multivibrator circuit is blocked, the output signal of the carrier wave detector will disappear and the energizing device responds by immediately interrupting the supply of the control-signal required for continuation of the operation. In this case a so-called "fail-safe" construction is obtained.

In case of such application, the current measuring system according to the invention does not operate as a system having a linear transfer function but as a bistable response system with normal multivibrator operation in one stable state or an interrupted or blocked multivibrator operation in the other stable state. It will be obvious that such a bistable use of the current measuring system according to the invention provides various possibilities of use for the detection of the occurrence of specially desired or specially non-desired conditions, situations and phenomena which may come up under all kinds of conditions in practice and which are of great importance for an industrial process.

It should finally be noted that current measuring systems of the type shown in FIGS. 2 and 3 in accordance with the invention may, for the major part, be constructed in the form of so-called "integrated circuits" and of very compact units so that such systems are suitable for mass production at low costs and for incorporation in existing functional devices such as earth leakage switches. Moreover, such systems may provide such a contribution to improvement and completion of the significant properties of functional devices that they may be considered to be an essential constituent of new functional devices, of which such system may form an integral part.

Particularly when a measuring system according to the invention is used in earth leakage switch or as an integral part thereof, a considerably higher safety is obtained, since the system is sensitive to the (positive and negative) half cycles of alternating current and to direct current and has, moreover, for the matching impedance value of the measuring current circuit a response time which is independent of the leakage current.

The invention is, of course, not limited to the embodiments depicted in the foregoing and illustrated in the drawings. Modifications of various kinds may be made for the components and their relationships within the spirit and scope of this invention. It is noted in particular that the term "secondary winding" as used in this context is only used for a winding directly coupled with the switching device and (preferably also)/or with the detection device, but does not relate to any other "tertiary" winding not connected in the said manner, which might be used in the current measuring system for other purposes, for example, for feedback in connection with linearization.

What is claimed herein is:

1. A current measuring system, more particularly suitable for use as an earth leakage detection system, comprising a weak magnetic circuit having a primary winding to be traversed by a current to be measured and having a secondary winding, a reversible transistor switch network comprising four transistors connected in a bridge such that the emitter/collector paths of one pair of the transistors are connected between a first pair of points of said bridge whereas the emitter/collector paths of the other pair of the transistors are also connected between said first pair of points, in parallel with the one pair of transistors, the bases of said one pair of transistors being connected through respective bias resistor means to a third point of said bridge and the bases of said other pair of transistors being connected through respective bias resistor means to a fourth point of said bridge, the transistors of each pair being of opposite conductivity type and the collectors of said one pair of transistors being connected to said fourth point and the collectors of said other pair of transistors being connected to said third point whereby only two of said transistors, one from each pair, are conducting at any one time and the polarity across said third and fourth points in relatively reversed when conduction is switched between those two transistors which are one transistor of each pair and those two transistors which are the other transistor of each pair, integrating load impedance means for producing an output signal in response to unbalanced switching of said transistors, said secondary winding being connected in series with said load impedance means between said third and fourth points of said bridge, and a current limiting circuit means, for initiating switching of said transistors, a voltage source, said current limiting circuit means being connected across said source and in series with the source between said first pair of points of the bridge whereby the voltage across said first pair of points is abruptly reduced, when a predetermined limiting current value is reached by those two transistors conducting at that time, so that those two transistors conducting at that time are rendered non-conducting whereas the other two transistors are rendered conducting by the self inductance of said secondary winding thereby to switch the polarity across said secondary winding and the integrating load impedance.

2. A current measuring system as claimed in claim 1, characterized in that the inhibiting circuit is formed by a current mirror circuit including a current measuring resistor determining the current limit value by its resistance value.

3. A current measuring system as claimed in claim 1, characterized in that a capacitor is connected in parallel to at least one of the windings of the magnetic circuit.

4. A current measuring system as claimed in claim 3, characterized in that the capacitor has a sufficiently high capacity value that when the magnetic circuit approaches the state of saturation, that the capacitor together with the associated winding produces an instantaneous field strength which at least corresponds to the saturation inductance of the magnetic circuit.

5. A system as defined in claim 1 wherein said current limiting circuit means comprises first transistor means in series with said source between said first pair of points and second transistor means connected across said source and to said first transistor means for biassing the latter.

6. A system as defined in claim 5 wherein said first transistor means comprises a first transistor having an emitter/collector path connected in series with said source and having a base terminal, said second transistor means comprising a second transistor having an emitter/collector path connected between said first pair of points, having a base terminal connected to the base terminal of said first transistor and having a connection between its emitter/collector path and said base terminals.

7. A system as defined in claim 6 wherein said second transistor means also includes a resistor in the emitter/collector path of said second transistor and a third transistor having an emitter/collector path in parallel with said resistor and having a base terminal connected to the emitter/collector path of said first transistor.

* * * * *